United States Patent
Iwabuchi et al.

(10) Patent No.: US 7,023,178 B2
(45) Date of Patent: Apr. 4, 2006

(54) VOLTAGE MEASURING APPARATUS

(75) Inventors: Akio Iwabuchi, Niiza (JP); Kazuya Aizawa, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 11/077,624

(22) Filed: Mar. 10, 2005

(65) Prior Publication Data

US 2005/0218900 A1    Oct. 6, 2005

(30) Foreign Application Priority Data

Mar. 29, 2004   (JP) .............................. 2004-096154

(51) Int. Cl.
*H02J 7/00*   (2006.01)

(52) U.S. Cl. .................................... 320/116

(58) Field of Classification Search ............... 320/116, 320/119; 324/426, 434; 340/636.12
See application file for complete search history.

(56) References Cited

U.S. PATENT DOCUMENTS

| | | | | |
|---|---|---|---|---|
| 4,833,459 A | * | 5/1989 | Geuer et al. ............ | 340/636.12 |
| 5,818,201 A | * | 10/1998 | Stockstad et al. ........... | 320/119 |
| 6,020,717 A | * | 2/2000 | Kadouchi et al. ........... | 320/116 |
| 6,147,499 A | * | 11/2000 | Torii et al. .................. | 324/434 |
| 6,157,165 A | * | 12/2000 | Kinoshita et al. ........... | 320/116 |
| 6,362,627 B1 | * | 3/2002 | Shimamoto et al. ........ | 324/434 |

FOREIGN PATENT DOCUMENTS

| DE | 19605481 | * | 6/1997 |
|---|---|---|---|
| JP | 2001-116777 | | 4/2001 |

* cited by examiner

*Primary Examiner*—Pia Tibbits
(74) *Attorney, Agent, or Firm*—Kilpatrick Stockton LLP

(57) ABSTRACT

The voltage measuring apparatus includes a voltage measuring unit 2 being connected to a battery 1, a voltage converting unit 3 connected to the voltage measuring unit 2, and a controller 4 which controls the operation of the voltage measuring unit 2 based on output of the voltage converting unit 3. The voltage measuring unit 2 includes Pch-MOSFET elements P1 and P2 constituting a first switch group connected to both terminals of a voltage source Vcn in the battery 1, a capacitor Cn connected between the elements P1 and P2, and Nch-MOSFET elements N3 and N4 constituting a second switch group connected to both terminals of the capacitor Cn and to both terminals of the voltage output terminal. A source and a back gate of the Nch-MOSFET element N3 of the second switch group are connected to each other.

7 Claims, 5 Drawing Sheets

VOLTAGE MEASURING APPARATUS

BACKGROUND OF THE INVENTION

The present invention relates to a voltage measuring apparatus which measures voltage of a voltage source, and more particularly, to a technique for enhancing measurement precision.

In terms of environmental protection, there are known electric cars having a motor as a driving source for driving the car, and hybrid vehicles having a motor and an engine. As an electric power source for driving the motor, several hundred storage batteries or fuel cells (generally called "batteries", hereinafter) are connected to one another in series and used in many cases. Therefore, in order to monitor a state-of-charge, a state-of-discharge, life of each battery, abnormal condition and the like which are varied from moment to moment during running, there is an increasing requirement for precisely measuring terminal voltage of battery cells which are connected to one another in series and to which a few hundred volts of electrical power is applied.

To meet such a requirement, measurement of terminal voltage of a battery is carried out in such a manner that a plurality of battery cells constituting a battery are modularized, a capacitor element is recharged using voltage of each module through a first switch group, the first switch group is turned OFF and then, the capacitor element is connected to a voltage measuring device through a second switch group.

For example, in Japanese Patent Application Laid-open No. 2001-116777, a photo MOSFET or an element corresponding to the photo MOSFET is used as a switch element. It is easy to separate a switch driving signal system and a measuring voltage signal system from each other, a switch driving signal is not easily affected by measuring voltage, and no special arrangement is required for a switch driving circuit.

SUMMARY OF THE INVENTION

However, the technique disclosed in the above patent document has the following problems.

(1) In the case of the photo MOSFET, speed of response is slow and the speed of response is also varied largely. Thus, it is necessary to secure enough time for switching timing of each switch, and it is difficult to precisely and quickly turn the switch ON and OFF for charging and discharging operations.

(2) It is difficult to make the photo MOSFET smaller and to increase the packing density of the photo MOSFET due to its structure, and the measuring apparatus is increased in size and cost.

(3) An electric power source is required for driving the photo MOSFET. If the number of portions to be measured is increased, large current is required.

(4) When voltage of a fuel cell whose operation temperature becomes higher than that of a storage battery is to be measured, its circuit must withstand such high operation temperature, but the photo MOSFET cannot withstand high temperature easily.

(5) Each switch does not have protection function. Therefore, even if the switch is designed such that short-circuit current does not flow through the switch by securing enough time for the switching timing, if a driving signal is erroneously operated due to large noise from a motor or an engine, the short-circuit current flows and the voltage measuring circuit is damaged. This is a critical problem.

The present invention has been achieved in order to solve these problems, and the invention provides a small and inexpensive voltage measuring apparatus having high noise immunity, which can precisely measure terminal voltage of a battery cell at high speed without using any special electric power source.

According to a technical aspect of the present invention, there is provided a voltage measuring apparatus which measures voltage between a first node and a second node of a circuit having a plurality of voltage sources, comprising: a first switch group having a first type first MOSFET with a first type conductivity and a first type second MOSFET with the first type conductivity, a first main electrode of the first type first MOSFET being connected to the first node, voltage corresponding to voltage of the first main electrode being applied to its control electrode, the first type first MOSFET being turned ON and OFF in accordance with the voltage of the control electrode, a first main electrode of the first type second MOSFET being connected to the second node, voltage corresponding to voltage of the first main electrode being applied to its control electrode, and the first type second MOSFET being turned ON and OFF in accordance with voltage of the control electrode; a capacitor being connected between a second main electrode of the first type first MOSFET and a second main electrode of the first type second MOSFET; a second switch group having a second type first MOSFET with a second type conductivity that is opposite from the first type conductivity and a second type second MOSFET with the second type conductivity, the second main electrode of the second type first MOSFET being connected to the second main electrode of the first type first MOSFET, the second type first MOSFET being turned ON and OFF in accordance with a signal inputted to its control electrode, the second main electrode of the second type second MOSFET being connected to the second main electrode of the first type second MOSFET, the second type second MOSFET being turned ON and OFF in accordance with a signal inputted to its control electrode; a third switch group having a second type third MOSFET with the second type conductivity and a second type fourth MOSFET with the second type conductivity, a second main electrode of the second type third MOSFET being connected to a control electrode of the first type first MOSFET, the second type third MOSFET being turned ON and OFF in accordance with a signal inputted to a control electrode, a second main electrode of the second type fourth MOSFET being connected to a control electrode of the first type second MOSFET, the second type fourth MOSFET being turned ON and OFF in accordance with a signal inputted to a control electrode; and a controller turning ON the first switch group in accordance with ON operation of the third switch group and turning OFF the first switch group in accordance with OFF operation of the third switch group, wherein the first main electrode of the second type first MOSFET of the second switch group and the back gate electrode thereof are connected to each other.

DESCRIPTION OF THE PREFERRED EMBODIMENTS

Preferred embodiments of a voltage measuring apparatus according to the present invention will be explained below in detail with reference to the accompanying drawings.

First Embodiment

Figure 1:
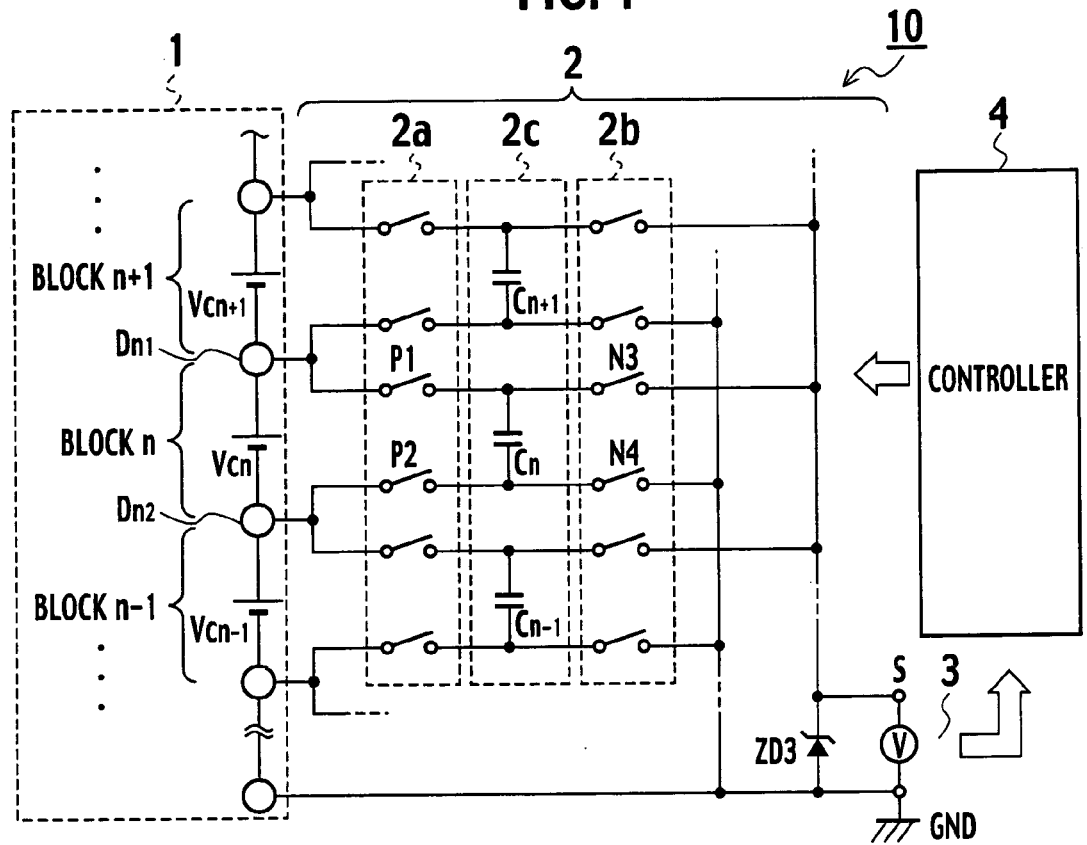
FIG. 1 is a system block diagram of a voltage measuring apparatus according to a first embodiment.

FIG. 1 shows the entire structure of a voltage measuring apparatus 10 according to a first embodiment. In FIG. 1, a battery 1 includes a plurality of voltage sources Vi (i=1, 2, ..., Cn−1, Cn, Cn+1, ..., N) which are connected to one another in series. A capacitor group 2c is charged using voltage of each voltage source through a first switch group 2a. The first switch group 2a is turned OFF and then, capacitors are connected to respective voltage measuring devices through a second switch group 2b, thereby measuring a terminal voltage of the battery 1. A plurality of voltage measuring apparatuses are packed on one chip, one of measuring terminals of a plurality of blocks is selected, and the voltage is measured using one voltage measuring device.

The voltage measuring apparatus according to the first embodiment comprises a voltage measuring unit 2 connected to the battery 1, a voltage converting unit 3 connected to an output side of the voltage measuring unit 2, and a controller 4 which controls operation and the like of the voltage measuring unit 2 based on output of the voltage converting unit 3.

Generally, the battery 1 is a circuit having a plurality of voltage sources (cells). The voltage measuring device of this invention measures a voltage between predetermined nodes. In this embodiment, a series circuit of cells will be explained as a typical example of the circuit, and an assembly of one or more cells between nodes is called a block.

The battery 1 according to the first embodiment comprises N-number (N is an integer of 1 or more) of blocks (only blocks n−1, n, n+1 are shown in the drawings) which are connected to one another in series. In each block i, a plurality of battery cells are connected to one another in series, and each battery cell constitutes a voltage source (only voltage sources n−1, n, n+1 respectively corresponding to the blocks Vcn−1, Vcn, Vcn+1 are shown in the drawings) This battery 1 outputs voltage as high as 100 to 200V for example.

The voltage measuring unit 2 comprises N-number of voltage measuring circuits which are disposed in each block of the battery 1. Each voltage measuring circuit includes the first switch group 2a (P1, P2 corresponding to block n in the drawings), the capacitor group 2c as a storing element (only Cn−1, Cn, Cn+1 respectively corresponding to the blocks n−1, n, n+1 are shown in the drawings), and the second switch group 2b (N3, N4 corresponding to the block n in the drawings). Voltage of each block of the battery 1 is outputted to and held by a capacitor through the first switch group 2a in accordance with a control signal from the controller 4, and the voltage held by the capacitor is outputted to the voltage converting unit 3 through the second switch group in accordance with a control signal from the controller 4.

The voltage converting unit 3 comprises an A/D converter for example, and converts voltage supplied from the voltage measuring unit 2 as an analog signal into a digital signal, and sends the digital signal to the controller 4.

The controller 4 supplies a control signal to the voltage measuring unit 2 to control the operation thereof, and adds a digital signal output from the voltage converting unit 3 to the control signal, and calculates voltage of the entire battery 1 or voltage of each block. The calculated voltage is used for monitoring a state-of-charge, a state-of-discharge, life of the battery, abnormal condition and the like of the battery 1.

Figure 2:
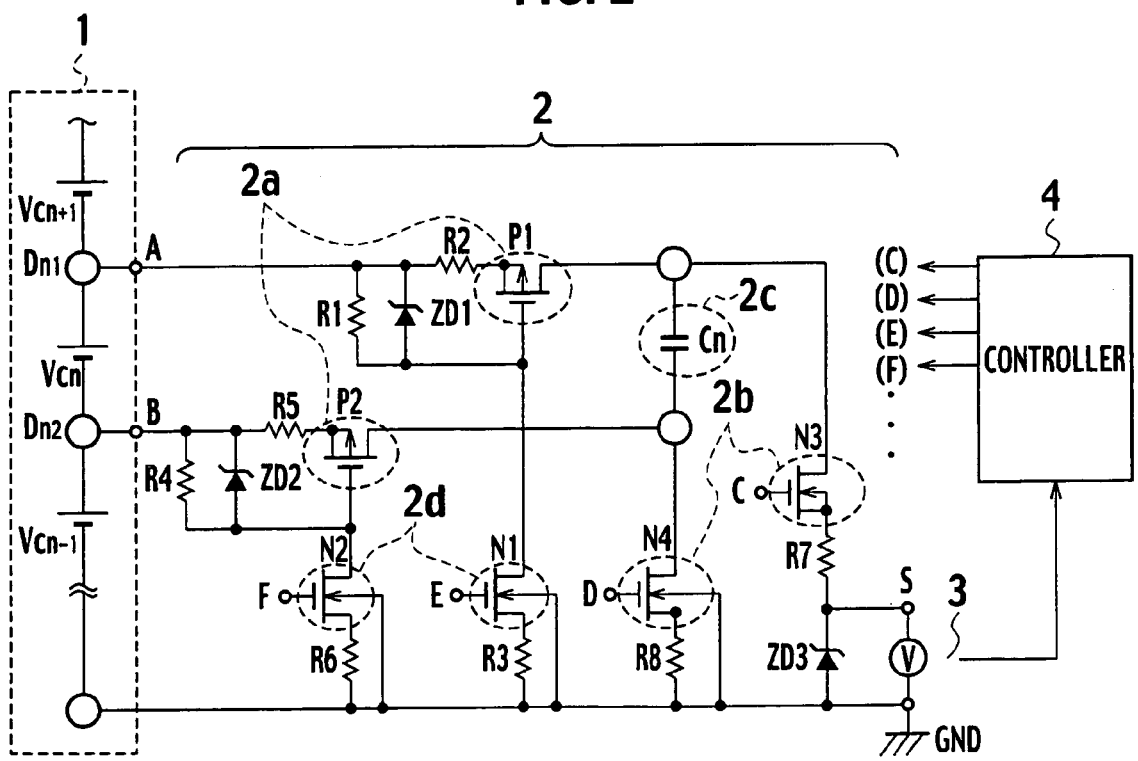
FIG. 2 is a circuit diagram in the voltage measuring apparatus according to the first embodiment.

FIG. 2 is a circuit diagram showing an example of a structure of the voltage measuring unit 2. The structure of the voltage measuring unit 2 corresponding to the block n will be explained in the example in the drawings in which the structure is the same as those of voltage measuring units 2 corresponding to other blocks.

The voltage measuring unit 2 shown in FIG. 2 comprises P-channel MOS field-effect transistors ("Pch-MOSFET", hereinafter) P1 and P2 as the first switch group, a capacitor Cn as a voltage holder connected to the first switch group, N-channel MOS field-effect transistors ("Nch-MOSFET", hereinafter) N3 and N4 as the second switch group connected to the first switch group through the capacitor Cn, and Nch-MOSFETs (N1, N2) as a third switch group 2d connected to a gate (capacitor element) of a first conductive type MOSFET of the first switch group. Elements capable of withstanding high voltage as high as 500V for example are used as these MOSFETs (P1, P2, N1 to N4). The transistors included by the first switch group are referred as first type MOSFETs having a first type conductivity, and the transistors included by the second switch group are referred as second type MOSFETs having a second type conductivity hereafter.

First Switch Group

The first switch group connected to both ends of a voltage source Vcn corresponding to the block n in the battery 1 comprises switch elements P1 and P2 comprising Pch-MOSFETs. The switch element P1 (first type first MOSFET having a first type conductivity) is connected to one of voltage input terminal (first voltage input terminal) A of the voltage source Vcn, and the switch element P2 (first type second MOSFET having the first type conductivity) is connected to the other voltage input terminal (second voltage input terminal) B. The first voltage input terminal A is a first node Dn1 of the voltage source circuit, and the second voltage input terminal B is a second node Dn2 of the voltage source circuit.

In the switch element P1, a source (first main electrode) is connected to the voltage input terminal A through a resistor R2, a drain (second main electrode) is connected to one of terminals of the capacitor Cn (capacitor element), and a gate (capacitor element) is connected to a drain (second main electrode) of a switch element N1 (second type third MOSFET having a second type conductivity included by a third switch group), and a back gate (substrate) is connected to a source of the switch element P1. A Zener diode ZD1 and a resistor R1 functioning as limiters of gate voltage are connected in parallel between the back gate and the gate of the switch element P1 for determining gate voltage of the switch element P1. That is, in the Zener diode ZD1, a cathode is connected to the back gate of the switch element P1, and an anode is connected to the gate of the switch element P1. The resistor R2 corresponds to a resistor element constituting a current limiting unit, and the Zener diode ZD2 corresponds to a voltage limiting element constituting a current limiting unit. That is, the current limiting unit comprising the resistor R2 and the Zener diode ZD1 limits current flowing to the switch element P1, thereby preventing the switch element P1 from being destroyed.

In the switch element P2, a source (first main electrode) is connected to the voltage input terminal B through a resistor R5, a drain (second main electrode) is connected to the other terminal of the capacitor Cn, a gate (control electrode) is connected to a drain (second main electrode) of a switch element N2 (second type fourth MOSFET having the second type conductivity which is included by the third switch group), and a back gate (substrate) is connected to the source of the switch element P2. The Zener diode ZD2 and the resistor R4 functioning as limiters of gate voltage are connected in parallel between the back gate and the gate of the switch element P2 for determining the gate voltage of the switch element P2. That is, in the Zener diode ZD2, a cathode is connected to the back gate of the switch element P2, and an anode is connected to the gate of the switch element P2. The resistor R5 is a current limiting element, and the Zener diode ZD2 is a voltage limiting element, and they constitute a current limiting unit. That is, the current limiting unit comprising the resistor R5 and the Zener diode ZD2 limits current flowing to the switch element P2, thereby preventing the switch element P2 from being destroyed.

Third Switch Group

The switch element N1 (second type third MOSFET having the second type conductivity) drives the switch element P1. In the switch element N1, a drain (second main electrode) is connected to the gate of the switch element P1 as described above, a source (first main electrode) is connected to the ground (GND) through the resistor R3, and a back gate (substrate) is connected to the ground. The resistor R3 is a resistor element constituting a current limiting unit, and limits current flowing to the switch element N1, thereby preventing the switch element N1 from being destroyed.

A gate (control electrode) of the switch element N1 is connected to a control signal input terminal E. High level ("H-level", hereinafter) voltage is applied to the control signal input terminal E from the controller 4 and with this, the switch element N1 is turned ON. As a result, the switch element P1 is also turned ON, and voltage from the voltage input terminal A is applied to one of the terminals of the capacitor Cn.

The switch element N2 (second conductive type fourth MOSFET) drives the switch element P2. In the switch element N2, a drain (second main electrode) is connected to the gate of the switch element P2 as described above, a source (first main electrode) is connected to the ground (GND) through the resistor R6, and a back gate (substrate) is connected to the ground. The resistor R6 is a resistor element constituting a current limiting unit, and limits current flowing to the switch element N2, thereby preventing the switch element N2 from being destroyed.

A gate (control electrode) of the switch element N2 is connected to a control signal input terminal F. H level voltage is applied to the control signal input terminal F from the controller 4 and with this, the switch element N2 is turned ON. As a result, the switch element P2 is also turned ON, and voltage from the voltage input terminal B is applied to the other terminal of the capacitor Cn.

Second Switch Group

In the switch element N3 (second conductive type first MOSFET), a drain (second main electrode) is connected to one of terminals of the capacitor Cn, a source (first main electrode) is connected to one of voltage output terminals S through a resistor R7 and to a cathode of a Zener diode ZD3. An anode of the Zener diode ZD3 is connected to the ground (GND). Since input impedance of the A/D converter in the voltage converting unit 3 is extremely high, voltage of the one voltage output terminal S is increased due to capacitance or leak current, thereby protecting the MOSFET of the second switch group so that it is not destroyed.

In the switch element N3, a back gate (substrate) is connected to a source, and a gate (control electrode) is connected to a control signal input terminal C. Therefore, H-level voltage is applied to the control signal input terminal C from the controller 4, the switch element N3 is turned ON, potential of one of the terminals of the capacitor Cn is outputted to the voltage output terminal S.

In a switch element N4 (second conductive type second MOSFET), a drain (second main electrode) is connected to the other capacitor Cn, a source (first main electrode) is connected to the ground through a resistor RB, a back gate (substrate) is connected to a source, and a gate is connected to a control signal input terminal D. Thus, H-level voltage is applied to the control signal input terminal D from the controller 4, the switch element N4 is turned ON, potential of the other terminal of the capacitor Cn is outputted to the ground (GND) which also functions as the other voltage output terminal.

The switch elements P1 and P2 comprise transistors capable of withstanding high voltage, and the voltage source Vcn being connected to the voltage input terminals A and B can be also used as a gate driving electric power source of the switch elements P1 and P2.

The resistor R1 and the Zener diode ZD1 are connected in parallel between the gate and the source of the withstand-voltage switch element P1, via the resistor R2. Therefore, for the duration of ON state of the withstand-voltage switch element (Nch-MOSFET) N1, the Zener diode ZD1 causes Zener breakdown, and voltage between the gate and the source of the switch element P1 can be maintained at breakdown voltage. For the duration of OFF state of the switch element N1, the gate and the source of the switch element P1 is short-circuited by the resistor R1, gate electric charge of the switch element P1 stored for the duration of ON state is discharged, and gate potential of the switch element P1 is fixed to source potential.

Similarly, the resistor R4 and the Zener diode ZD2 are connected in parallel between the gate and the source of the withstand-voltage switch element (Pch-MOSFET) P2, via the resistor R2. Therefore, for the duration of ON state of the withstand-voltage switch element (Nch-MOSFET) N2, the Zener diode ZD2 causes Zener breakdown, and voltage between the gate and the source of the switch element P2 can be maintained at breakdown voltage. For the duration of OFF state of the switch element N2, the gate and the source of the switch element P2 is short-circuited by the resistor R4, gate electric charge of the switch element P2 stored for the duration of ON state is discharged, and gate potential of the switch element P2 is fixed to source potential.

Therefore, in order to turn the switch elements P1 and P2 ON and OFF, it is unnecessary to produce voltage to be applied to the gate using special electric power source, and the voltage measuring apparatus can be made smaller in size and inexpensive.

The first switch group may comprise a withstand-voltage Nch-MOSFET. However, if the first switch group uses the withstand-voltage switch elements (Pch-MOSFETs) P1 and P2, the circuit structure becomes simpler as compared with a circuit comprising the withstand-voltage Nch-MOSFET for the same purpose. That is, when the withstand-voltage Nch-MOSFET is used instead of the withstand-voltage Pch-MOSFET (P1, P2), in order to turn the Nch-MOSFET ON, it is necessary that the gate potential is higher than a source potential by a threshold value voltage thereof. When the Nch-MOSFET is turned ON, the source potential rises to a value close to potential of the drain-side voltage source. Therefore, if the gate potential is not increased to a value higher than the potential of the voltage source, the Nch-MOSFET cannot continue its ON state. Thus, unlike the case where the Pch-MOSFET is used, the voltage source cannot be used as a gate driving electric power source as it is, and an additional circuit which produces gate driving voltage which is higher than the potential of the voltage source of the voltage input terminals A, B by the threshold value voltage is required. In order to produce such gate driving voltage, it is possible to use a floating electric power source driving method, a bootstrap driving method, a charge pump driving method and the like, however, the circuit structure becomes complicated.

Voltage Measuring Unit

The operation of the voltage measuring unit 2 will be explained. A low level ("L-level", hereinafter) control signal is supplied to each of the control signal input terminals C and D from the controller 4, and an H-level control signal is supplied to each of the control signal input terminals E and F. Accordingly, the switch elements (Nch-MOSFETs) N1 and N2 are turned ON and as a result, the switch elements (Pch-MOSFETs) P1 and P2 are turned ON. The switch elements (Nch-MOSFETs) N3 and N4 are turned OFF.

In this state, a current flows from one block n of the battery 1, and the capacitor Cn is recharged. During this recharging operation, the control signals supplied to the control signal input terminals E and F are maintained at H-level until voltage between both terminals of the capacitor Cn becomes equal to voltage between both the terminals of the voltage source Vcn of the block n.

Next, L-level control signals are supplied to the control signal input terminals E and F from the controller 4. Accordingly, the switch elements N1 and N2 are turned OFF and as a result, the switch elements P1 and P2 are turned OFF. The OFF states of the switch elements N3 and N4 are maintained. In this state, the capacitor Cn holds voltage based on the above-described recharging operation.

The H-level control signals are supplied from the controller 4 to the control signal input terminals C and D. Accordingly, the switch elements N3 and N4 are turned ON. As a result, voltages of both ends of the capacitor Cn are output between one of the voltage output terminals S and the ground (GND) functioning as the other voltage output terminal. Thereafter, the above-described measuring cycle is repeated.

Figure 3:
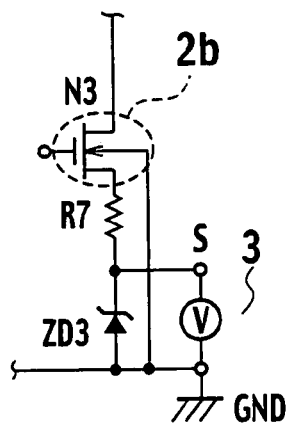
FIG. 3 is a diagram showing a comparison example of a bias circuit of a second switch group N3 shown in FIG. 2.

FIG. 3 shows a circuit structure of the switch group N3 shown in FIG. 2 for comparison. In FIG. 3, if the back gate of the second switch group (Nch-MOSFET) N3 is connected to the ground (GND), in order to measure a battery having high terminal voltage, since a threshold value of the second switch group (Nch-MOSFET) N3 rises, higher gate voltage is required.

On the other hand, in the case of the voltage measuring apparatus of this embodiment shown in FIG. 2, the back gate of the second switch group (Nch-MOSFET) N3 is biased relative to the ground potential (GND), and the back gate and the source share common function. Therefore, a substrate bias effect is not generated unlike the voltage measuring apparatus shown in FIG. 3. According to the circuit structure of this embodiment, a plurality of voltage measuring apparatuses (in FIG. 3) of a battery can be packed on one chip, and the voltage measuring terminal S can commonly be used.

As explained above, according to the first embodiment, as switches constituting the first to the third switch groups, the Pch-MOSFET and the Nch-MOSFET are used instead of the photo MOSFET, and the back gate of the second switch group (Nch-MOSFET) N3 is connected to its source. As a result, the speed of response is increased, and switching operation for recharging and discharging operations of the capacitor can precisely and quickly be carried out. Even if the block voltage of the voltage source Vcn is increased, the substrate bias effect is not generated. Thus, the gate voltage of the Nch-MOSFET element N3 can be turned ON and OFF with a predetermined threshold value. As a result, even if the block voltage is high, voltage can be measured precisely and quickly.

The Pch-MOSFET constituting the first switch group is turned ON and OFF in accordance with voltage applied to the control electrode based on voltage from the voltage source, and the Nch-MOSFET constituting the second and the third switch groups are turned ON and OFF in accordance with signals from outside. Thus, an inexpensive and small voltage measuring apparatus can be realized without the need for special electric power source.

Second Embodiment

According to the first embodiment (see FIGS. 1 and 2), the plurality of voltage measuring units corresponding to voltage sources of the blocks in the battery 1 are packed in one chip, the measuring terminals of the blocks are commonly used, and voltage is measured using one of the voltage measuring devices. In this case, the Nch-MOSFET element N3 of the second switch group in the voltage measuring unit 2 has a horizontal MOSFET structure.

Figure 4:
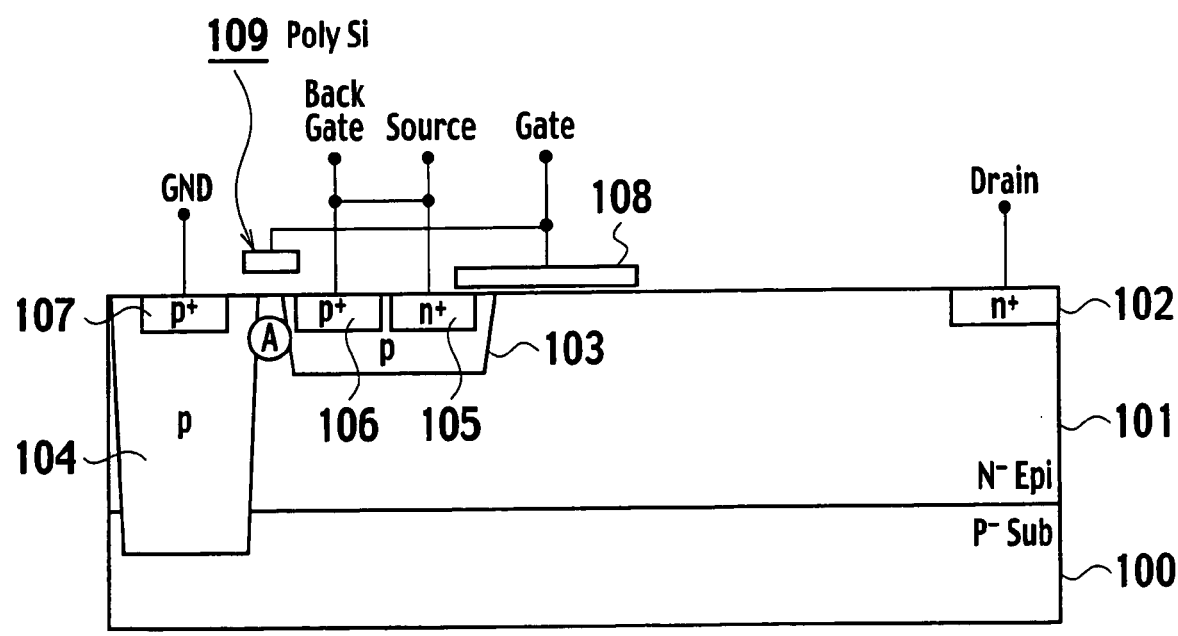
FIG. 4 is a cross sectional view of a structure of an Nch-MOSFET element N3 in a voltage measuring unit according to the first embodiment.
Figure 5:
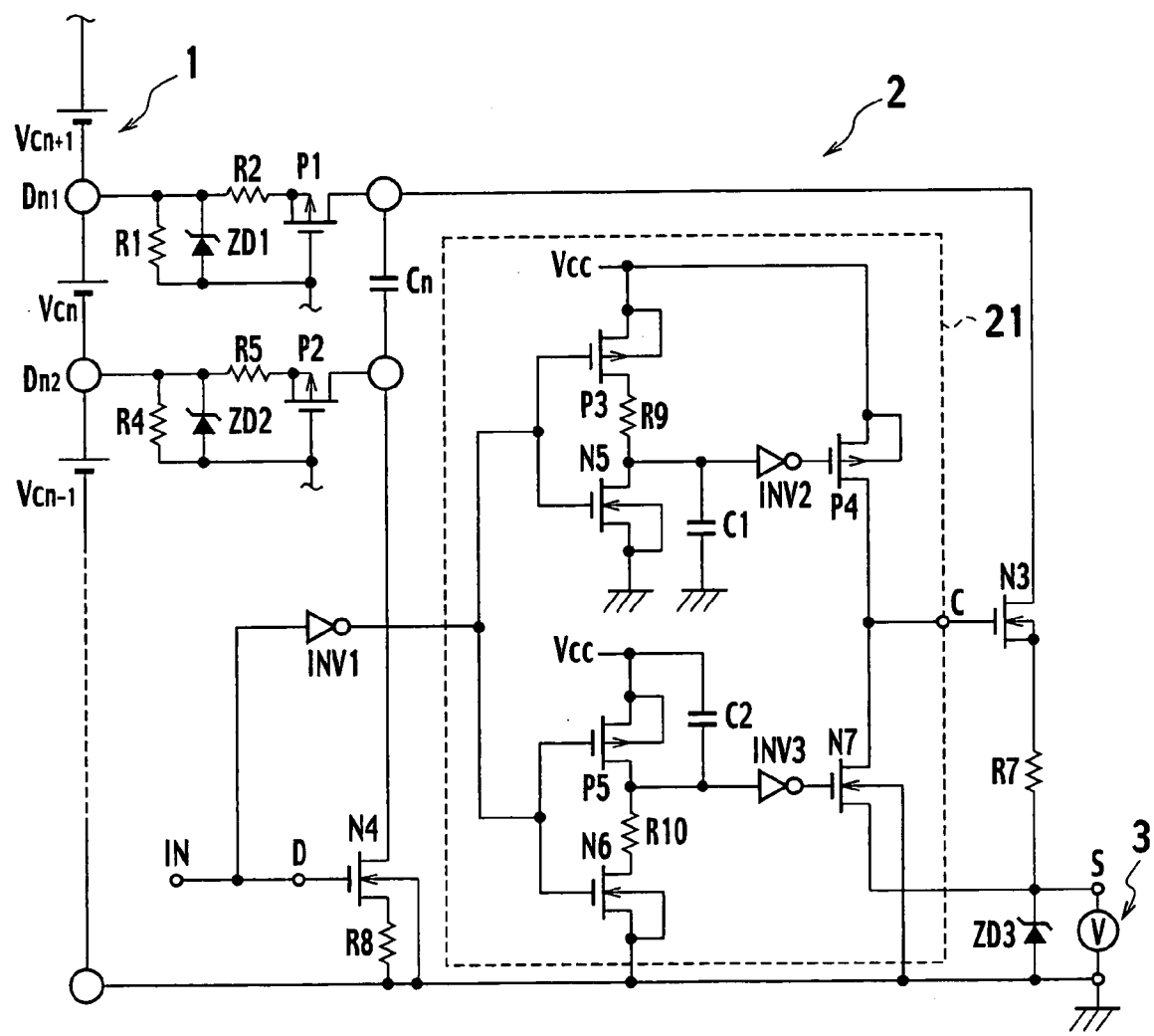
FIG. 5 is a circuit diagram of a voltage measuring unit having an ON/OFF driving circuit in a voltage measuring apparatus according to a second embodiment.

FIG. 4 is a sectional view of the Nch-MOSFET element N3 having the horizontal MOSFET structure. For comparison, FIG. 5 shows a cross section of the structure of the Nch-MOSFET whose back gate is connected to the ground (GND).

In the Nch-MOSFET element N3 shown in FIG. 4, the source and the back gate are connected to each other to suppress the substrate bias effect as described above. An N+ region 102 connected to the drain, a P well 103 formed with an N+ region 105 connected to the source and a P+ region 106 connected to the back gate, and a well 104 formed with a P+ region 107 connected to the ground are provided in an N-type Si epitaxial growth layer (N-Epi) 101 formed on a P-type Si substrate (P-Sub). A polysilicon gate 108 is formed on an N-Epi 101 between the two N+ regions 102 and 105 on the source side and on the drain side through an oxide (not shown). A polysilicon gate 109 is formed on an N-Epi 101 between the two P+ regions 106 and 107 on the back gate side and on the ground side through an oxide (not shown).

In this case, if the terminal voltage of the voltage source Vcn of the block n is outputted to the voltage converting unit 3, since the voltage output terminal (measuring terminal) S is common, Vcn is applied to voltage output terminals S of other blocks also in addition to the block n. Therefore, the source potential of the Nch-MOSFET element N3 becomes Vcn, and since the gate voltage of the Nch-MOSFET element N3 at that time is 0V, parasitic Pch-MOS existing between the two P+ regions 106 and 107 (portion A in FIG. 4) in the N-Epi 101 shown in FIG. 4, depending upon a voltage value of Vcn is operated, and current adversely flows into the ground (GND) from the voltage output terminal S. The threshold value of the parasitic Pch-MOS is determined by concentration of the N-Epi 101 on the P-Sub 100 and thickness of an oxide (not shown) existing below the polysilicon gate 109.

In order to measure voltage more precisely when a voltage value of the voltage source of the battery 1 is high, the second embodiment has an ON/OFF driving circuit (parasitic Pch-MOS preventing circuit) of the Nch-MOS-FET element N3 in addition to the structure according to the first embodiment (FIGS. 1 and 2), thereby preventing the parasitic Pch-MOS existing in the portion A in FIG. 4 from operating.

Figure 6:
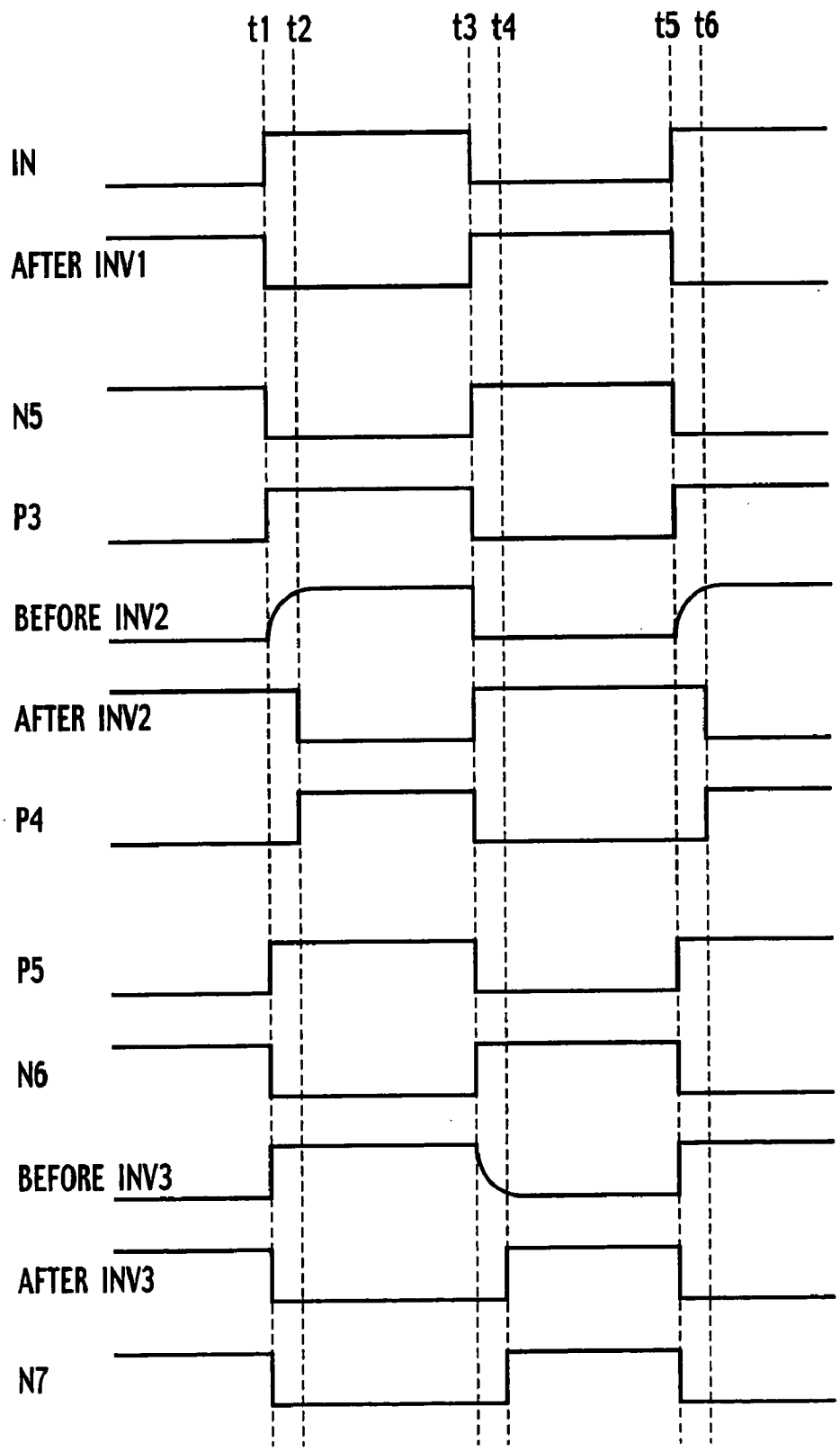
FIG. 6 is a diagram for explaining waveforms of terminal waveforms of the ON/OFF driving circuit shown in FIG. 5.

FIG. 5 is a circuit diagram showing a structure of a voltage measuring apparatus according to the second embodiment. FIG. 6 shows waveforms of terminals of the voltage measuring apparatus.

The basic structure of the voltage measuring apparatus shown in FIG. 5 is substantially the same as that of the first embodiment. The voltage measuring apparatus of the second embodiment is different from that of the first embodiment in that the second embodiment includes an ON/OFF driving circuit 21 as an ON/OFF driving signal forming unit which forms a signal (ON/OFF driving signal) inputted to the gate of the Nch-MOSFET element N3 of the second switch group.

The ON/OFF driving circuit 21 is provided with a Pch-MOSFET element P4 (first type third MOSFET having the first type conductivity) and an Nch-MOSFET element N7 (second type fifth MOSFET having the second type conductivity). The Pch-MOSFET element P4 constitutes a first driving switch. In the first driving switch, a source (a first main electrode) is connected to a driving electric power source Vcc, a drain (a second main electrode) is connected to a gate of the Nch-MOSFET element N3, and a back gate is connected to a source. The Nch-MOSFET element N7 constitutes a second driving switch. In the second driving switch, a source (a first main electrode) is connected to a source of the Nch-MOSFET element N3, a drain (a second main electrode) is connected to a gate of the Nch-MOSFET element N3, and a back gate is connected to the ground. That is, the Pch-MOSFET element P4 is connected between the driving electric power source Vcc and the gate of the Nch-MOSFET element N3, and the Nch-MOSFET element N7 is connected between the gate and the source of the Nch-MOSFET element N3.

Connected to the Pch-MOSFET element P4 as shown in the drawing are a Pch-MOSFET element P3 (first type fourth MOSFET having the first type conductivity), an Nch-MOSFET element N5 (a second type sixth MOSFET having the second type conductivity), a resistor 9 (a first resistor element), a capacity element C1 (a first capacity element), and an inverter INV2 (a second inverter). Connected to the Nch-MOSFET element N7 as shown in the drawing are a Pch-MOSFET element P5 (a first type fifth MOSFET having the first type conductivity), an Nch-MOSFET element N6 (a second type seventh MOSFET having the second type conductivity), a resistor 10 (a second resistor element), a capacity element C2 (a second capacity element), and an inverter INV3 (a third inverter).

In the Pch-MOSFET element P3, a source (a first main electrode) is connected to the driving electric power source Vcc, and a drain (a second main electrode) is connected to one of terminals of the resistor 9. In the Nch-MOSFET element N5, a source (a first main electrode) is connected to the ground, a drain (a second main electrode) is connected to the other terminal of the resistor R9 and the other terminal of the capacity element C1. In the resistor 9, one of terminals is connected to the drain of the Pch-MOSFET element P3, and the other terminal is connected to the drain of the Nch-MOSFET element N5. In the capacity element C1, one of terminals is connected to the drain of the Nch-MOSFET element N5 and to the other terminal of the resistor R9 and the other terminal is connected to the ground as a bypass circuit. In the inverter INV2, an input terminal is connected to one of terminals of the capacity element C1, and an output terminal is connected to the gate of the Pch-MOSFET element P4.

In the Pch-MOSFET element P5, a source (a first main electrode) is connected to the driving electric power source Vcc, and a drain (a second main electrode) is connected to one of terminals of the resistor 10 and to one of terminals of the capacity element C2. In the Nch-MOSFET element N6, a source (a first main electrode) is connected to the ground, and a drain (a second main electrode) is connected to the other terminal of the resistor 10. In the resistor 10, one of terminals is connected to the drain of the Pch-MOSFET element P5 and to one of terminals of the capacity element C2, and the other terminal is connected to the drain of the Nch-MOSFET element N6. In the capacity element C2, one of terminals is connected to the drain of the Pch-MOSFET element P5 and to the one of terminals of the resistor 10, and the other terminal is connected to the driving electric power source Vcc as a bypass circuit. In the inverter INV3, an input terminal is connected to one of terminals of the capacity element C2, and an output terminal is connected to the gate of the Nch-MOSFET element N7.

The gates (control electrodes) of the four MOSFET elements P3, N5, P5 and N6 are connected to the input terminal IN through the inverter INV1. A control signal input terminal D of the gate of the Nch-MOSFET element N4 is also connected to the input terminal IN.

With the above structure, delayed signals are inputted to the gates of the Pch-MOSFET element P4 and the Nch-MOSFET element N7 as two driving switches in such a way that those MOSFETs are not in ON state at the same time.

The operation of the ON/OFF driving circuit 21 will be explained with reference to FIG. 5. If an H-level signal is inputted to the input terminal IN from the controller 4 at time t1, its output waveform (after INV1) is changed to L-level in the inverter INV1.

Due to this L-level signal from the inverter INV1, the Pch-MOSFET element P5 is turned ON and the Nch-MOSFET element N6 is turned OFF on the side of the Nch-MOSFET element N7, it is pulled toward the driving electric power source Vcc, and in the inverter INV3, input waveform (before INV3) is changed to H-level, and output waveform (after INV3) is changed to L-level. Accordingly, the Nch-MOSFET element N7 is turned OFF at time t1.

On the other hand, on the side of the Pch-MOSFET element P4, the Nch-MOSFET element N5 is turned OFF and the Pch-MOSFET element P3 is turned ON due to the L-level signal from the inverter INV1, it is pulled toward the driving electric power source Vcc, and input waveform (before INV2) of the inverter INV2 is changed to H-level. This input waveform (before INV2) gently rises in accordance with delay time based on time constant determined by the resistor R9 and the capacity element C1. Thus, the output waveform (after INV2) from the inverter INV2 falls to L-level at time t2 that is delayed from time t1 by the delay time. Accordingly, the Pch-MOSFET element P4 is turned ON at time t2 not at time t1, and at time t2, the Pch-MOSFET element P4 is turned ON.

If L-level signal is inputted to the input terminal IN from the controller 4 at time t3, output waveform (after INV1) of the inverter INV1 is changed to H-level.

Due to the H-level signal from the inverter INV1, the Nch-MOSFET element N5 is turned ON and the Pch-MOSFET element P3 is turned OFF on the side of the Pch-MOSFET element P4, it is pulled toward the ground, and on the side of the inverter INV2, input waveform (before INV2) is changed to L-level, and output waveform (after INV2) is changed to H-level. As a result, the Pch-MOSFET element P4 is turned OFF at time t3.

On the other hand, on the side of the Nch-MOSFET element N7, due to the H-level signal from the inverter INV1, the Pch-MOSFET element P5 is turned OFF, the Nch-MOSFET element N6 is turned ON, it is pulled toward the ground, and input waveform (before INV3) of the inverter INV3 is changed to L-level. This input waveform (before INV3) gently falls in accordance with delay time based on time constant determined by the resistor R10 and the capacity element C2. Thus, the output waveform (after INV3) from the inverter INV3 rises to H-level at time t4 that is delayed from time t3 by the delay time. Accordingly, the Nch-MOSFET element N7 is turned ON at time t4 not at time t3, and at time t4, the gate of the Nch-MOSFET element N3 and its back gate/source are short-circuited.

Thereafter, in the same manner, if H-level signal waveform is inputted to the input terminal IN at time t5, the Nch-MOSFET element N7 is turned OFF at time t5, and the Pch-MOSFET element P4 is turned ON at time t6 that is delay from time t5.

Therefore, according to the ON/OFF driving circuit 21, if H-level signal is applied to the input terminal IN, the Nch-MOSFET element N7 is turned OFF, and after predetermined time delay, the Pch-MOSFET element P4 is turned ON, and the Nch-MOSFET element N3 is turned ON. If L-level signal is applied to the input terminal IN, the Pch-MOSFET element P4 is turned OFF, the Nch-MOSFET element N3 is turned OFF, and after predetermined time delay, the Nch-MOSFET element N7 is turned ON. That is, when the Nch-MOSFET element N3 is OFF, the Nch-MOSFET element N7 is turned ON and with this, the gate of the Nch-MOSFET element N3 and its back gate/source are short-circuited and potentials thereof become equal to each other. Thus, it is possible to stop the operation of the parasitic Pch-MOS existing in the portion A below the polysilicon gate 109 shown in FIG. 4.

The ON/OFF driving circuit 21 has function for delaying ON timings of the Pch-MOSFET element P4 and the Nch-MOSFET element N7 which drives the gate of the Nch-MOSFET element N3 by means of the resistor R9, the capacity element C1 and the inverter INV2, as well as the resistor R10, the capacity element C2 and the inverter INV3, respectively, so as to prevent both the P4 and N7 from turning ON at the same time. As a result, it is possible to avoid a case where the electric power source Vcc and the voltage output terminal S are short-circuited, current flows into the voltage output terminal S from the electric power source Vcc, and the measurement precision is deteriorated.

Further, since the input terminal IN and the input terminal of the ON/OFF driving circuit 21 are connected to each other through the inverter INV1, the Nch-MOSFET element N4 and the Nch-MOSFET element N3 can be turned ON and OFF by one control signal.

The ON/OFF driving circuit 21 of the embodiment can variously be modified. For example, even if the ON/OFF driving circuit 21 is replaced by an ON/OFF driving circuit 22 shown in FIG. 7, the same effect can be obtained.

Modification

Figure 7:
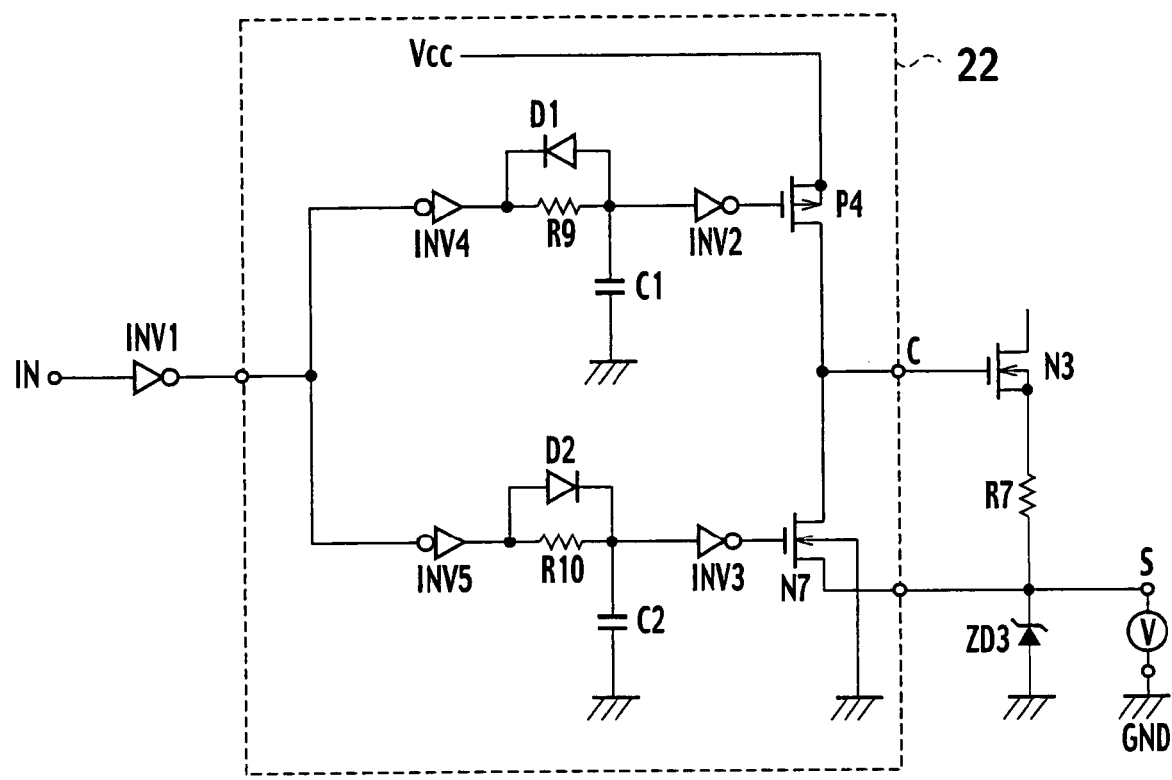
FIG. 7 is a circuit diagram of a voltage measuring unit having an ON/OFF driving circuit in a voltage measuring apparatus according to a modification.

In the ON/OFF driving circuit 22 as shown in FIG. 7, an inverter INV4 (fourth inverter) and a diode D1 (first diode) are provided instead of the Pch-MOSFET element P3 and the Nch-MOSFET element N5. Further, an inverter INV5 (fifth inverter) and a diode D2 (second diode) are provided instead of the Pch-MOSFET element P5 and the Nch-MOSFET element N6.

In the inverter INV4, an input terminal is connected to the inverter INV1, and an output terminal is connected to one of terminals of the resistor 9 and a cathode of the diode D1. The other terminal of the resistor 9 and an anode of the diode D1 are connected to one of terminals of the capacity element C1. One of terminals of the capacity element C1 is also connected to the input terminal of the inverter INV2. The other terminal of the capacity element C1 is connected to the ground as a bypass circuit.

Similarly, in the inverter INV5, an input terminal is connected to the inverter INV1, and an output terminal is connected to one of terminals of the resistor 10 and to an anode of the diode D2 in parallel. The other terminal of the resistor 10 and a cathode of the diode D2 are connected to one of terminals of the capacity element C2. One of terminals of the capacity element C2 is also connected to the input terminal of the inverter INV3. The other terminal of the capacity element C2 is connected to the ground as a bypass circuit.

According to this structure, if an H-level signal is applied to the input terminal IN, the Nch-MOSFET element N7 is turned OFF and then, the Pch-MOSFET element P4 is turned ON after predetermined time by the operations of the diode D1, the resistor 9, the capacity element C1 and the inverter INV2, and at this time point, the Nch-MOSFET element N3 is turned ON. If an L-level signal is applied to the input terminal IN, the Pch-MOSFET element P4 is turned OFF, the Nch-MOSFET element N3 is turned OFF and then, the Nch-MOSFET element N7 is turned ON after predetermined time by the operations of the diode D2, the resistor 10, the capacity element C2 and the inverter INV3. Accordingly, the same effect as that of the second embodiment can be obtained.

EFFECT OF THE INVENTION

According to the present invention, as switches constituting the first to the third switch groups, the first conductive type MOSFET and the second conductive type MOSFET are used instead of the photo MOSFET, and a back gate electrode of the second conductive type first MOSFET of the second switch group is connected to the first main electrode. Therefore, the speed of response is fast, and the switching operation for recharging and discharging the capacitor element can precisely and quickly be carried out. Thus, even if block voltage becomes high, the substrate bias effect is not generated and thus, the gate voltage of the second conductive type first MOSFET of the second switch group can be turned ON and OFF at a predetermined threshold value. As a result, even if block voltage is high, the voltage can be measured precisely and quickly.

The first conductive type MOSFET as the first switch group is turned ON and OFF in accordance with voltage applied to the control electrode based on voltage from a voltage source, and the second conductive type MOSFETs as the second and the third switch groups are turned ON and OFF in accordance from signals from outside. Thus, an inexpensive and small voltage measuring apparatus can be realized without the need for special electric power source.

According to the present invention, the first main electrode of the second conductive type first MOSFET of the second switch group and its back gate electrode are connected to each other. Therefore, a malfunction of the parasitic first conductive type MOS between the ground electrode and the back gate electrode that is caused when the back gate electrode of the second conductive type first MOSFET of the second switch group is connected to its first main electrode can be prevented by short-circuiting between the control electrode of the second conductive type first MOSFET of the second switch group and the first main electrode by means of the ON/OFF driving signal forming unit.

The ON/OFF timings of the first and the second driving switches which drives the control electrode of the second conductive type first MOSFET of the second switch group do not coincide with each other, the short-circuit between the driving electric power source and the voltage output terminal does not occur, and current flow caused by the short-circuit between blocks does not occur and thus, it is possible to prevent deterioration of the measurement precision.

INDUSTRIAL APPLICABILITY

As explained above, the present invention can be applied to a voltage measuring apparatus capable of precisely measuring terminal voltage of each battery cell of several hundred storage batteries and fuel cells which are connected to one another in series and to which a few hundred volts is applied and which are used in electric cars, hybrid vehicles and the like.

This application claims benefit of priority under 35USC §119 to Japanese Patent Applications No. 2004-96154, filed on Mar. 29, 2004, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A voltage measuring apparatus which measures voltage between a first node and a second node of a circuit having a plurality of voltage sources, comprising:
    a first switch group having a first type first MOSFET with a first type conductivity and a first type second MOSFET with the first type conductivity,
    a first main electrode of the first type first MOSFET being connected to the first node, voltage corresponding to voltage of the first main electrode being applied to its control electrode, the first type first MOSFET being turned ON and OFF in accordance with the voltage of the control electrode,
    a first main electrode of the first type second MOSFET being connected to the second node, voltage corresponding to voltage of the first main electrode being applied to its control electrode, and the first type second MOSFET being turned ON and OFF in accordance with voltage of the control electrode;
    a capacitor being connected between a second main electrode of the first type first MOSFET and a second main electrode of the first type second MOSFET;
    a second switch group having a second type first MOSFET with a second type conductivity that is opposite from the first type conductivity and a second type second MOSFET with the second type conductivity,
    the second main electrode of the second type first MOSFET being connected to the second main electrode of the first type first MOSFET, the second type first MOSFET being turned ON and OFF in accordance with a signal inputted to its control electrode,
    the second main electrode of the second type second MOSFET being connected to the second main electrode of the first type second MOSFET, the second type second MOSFET being turned ON and OFF in accordance with a signal inputted to its control electrode;
    a third switch group having a second type third MOSFET with the second type conductivity and a second type fourth MOSFET with the second type conductivity,
    a second main electrode of the second type third MOSFET being connected to a control electrode of the first type first MOSFET, the second type third MOSFET being turned ON and OFF in accordance with a signal inputted to a control electrode,
    a second main electrode of the second type fourth MOSFET being connected to a control electrode of the first type second MOSFET, the second type fourth MOSFET being turned ON and OFF in accordance with a signal inputted to a control electrode; and
    a controller turning ON the first switch group in accordance with ON operation of the third switch group and turning OFF the first switch group in accordance with OFF operation of the third switch group, wherein
    the first main electrode of the second type first MOSFET of the second switch group and the back gate electrode thereof are connected to each other.

2. The voltage measuring apparatus according to claim 1, further comprising
    a driving signal generator turning ON and OFF the second type first MOSFET of the second switch group, wherein
    the driving signal generator includes a first driving switch being connected between a driving electric power source terminal and the control electrode of the second type first MOSFET of the second switch group, and a second driving switch being connected between the control electrode and the first main electrode of the second type first MOSFET.

3. The voltage measuring apparatus according to claim 2, wherein
    the driving signal generator has a delay circuit which delays each control signal to be applied to the first driving switch and the second driving switch in such a way that timings at which the first driving switch and the second driving switch are turned ON do not coincide with each other.

4. The voltage measuring apparatus according to claim 2, further comprising
    a first inverter inverting a signal to be inputted to the control electrode of the second type second MOSFET, wherein an output from the first inverter is connected to an input terminal of the driving signal generator.

5. The voltage measuring apparatus according to claim 4, wherein
    the first driving switch comprises a first type third MOSFET with the first type conductivity, a first main electrode thereof connected to a driving source terminal, a second main electrode thereof is connected to a control electrode of the second type first MOSFET, and the first driving switch is turned ON and OFF in accordance with a signal inputted to the control electrode; and the second driving switch comprises a second type fifth MOSFET with the second type conductivity, a first main electrode thereof is connected to a first main electrode of the second type first MOSFET, a second main electrode thereof is connected to a control electrode of the second type first MOSFET, and the second driving switch is turned ON and OFF in accordance with a signal inputted to the control electrode.

6. The voltage measuring apparatus according to claim 5, wherein the delay unit comprises a first type fourth MOSFET with the first type conductivity, a control electrode thereof being connected to an output terminal of the first inverter, and a first main electrode thereof is connected to a driving power source terminal, a second type sixth MOSFET with the second conductivity type, a control electrode thereof being connected to an output terminal of the first inverter, a first main electrode thereof being connected to a ground terminal, and a second main electrode thereof being connected to a second main electrode of the first type fourth MOSFET, a first resistor element, one of terminals thereof being connected to the second main electrode of the first type fourth MOSFET, and other terminal thereof being connected to a second main electrode of the second type sixth MOSFET, a first capacity element, one of terminals thereof being connected to a second main electrode of the second type sixth MOSFET and to the other terminal of the first resistor element, and the other terminal of the first capacity element being connected to the ground terminal, a second inverter, an input terminal thereof being connected to one of terminals of the first capacity element, and an output terminal thereof being connected to a control terminal of the first type third MOSFET, a first type fifth MOSFET with the first conductivity type, a control electrode thereof being connected to the output terminal of the first inverter, and a first main electrode thereof being connected to the driving power source terminal, a second type seventh MOSFET with the second type conductivity, a control electrode thereof being connected to the output terminal of the first inverter, a first main electrode thereof being connected to the ground terminal, and a second main electrode thereof being connected to the second main electrode of the first type fifth MOSFET, a second resistor element, one of terminals thereof being connected to the second main electrode of the first type fifth MOSFET, and the other terminal thereof being connected to the second main electrode of the second type seventh MOSFET, a second capacity element, one of terminals thereof being connected to the second main electrode of the first type fifth MOSFET and to one of terminals of the resistor element, and the other terminal thereof being connected to the driving power source terminal, and a third inverter, an input terminal thereof being connected to one of terminals of the second capacity element, and an output terminal thereof being connected to a control terminal of the second type fifth MOSFET.

7. The voltage measuring apparatus according to claim 5, wherein the delay unit comprises a fourth inverter, an input terminal thereof being connected to the output terminal of the first inverter, a first resistor element, one of terminals thereof being connected to the output terminal of the fourth inverter, a first node, a cathode thereof being connected to the output terminal of the fourth inverter, a first capacity element, one of terminals thereof being connected to the other first resistor element and to an anode of the first diode, and the other terminal thereof being connected to the ground terminal, a second inverter, an input terminal thereof being connected to one of terminals of the first capacity element, and an output terminal thereof being connected to the control terminal of the first type third MOSFET, a second resistor element, an input terminal thereof being connected to a fifth inverter being connected to the output terminal of the first inverter, and one of terminals thereof being connected to the output terminal of the fifth inverter, a second diode, an anode thereof being connected to the output terminal of the fifth inverter, a second capacity element, one of terminals thereof being connected to the other terminal of the first resistor element and to a cathode of the second diode, and the other terminal thereof being connected to the ground terminal, and a third inverter, an input terminal thereof being connected to one of terminals of the second capacity element, and an output terminal thereof being connected to a control terminal of the second type fifth MOSFET.

* * * * *